(12) United States Patent
Kim et al.

(10) Patent No.: US 12,500,146 B2
(45) Date of Patent: Dec. 16, 2025

(54) SUBSTRATE(S) FOR AN INTEGRATED CIRCUIT (IC) PACKAGE EMPLOYING A METAL CORE FOR IMPROVED ELECTRICAL SHIELDING AND STRUCTURAL STRENGTH, AND RELATED IC PACKAGES AND FABRICATION METHODS

(71) Applicant: QUALCOMM Incorporated, San Diego, CA (US)

(72) Inventors: Michelle Yejin Kim, Carlsbad, CA (US); Hong Bok We, San Diego, CA (US); Joan Rey Villarba Buot, Escondido, CA (US); Kuiwon Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 376 days.

(21) Appl. No.: 18/303,072

(22) Filed: Apr. 19, 2023

(65) Prior Publication Data

US 2024/0355712 A1 Oct. 24, 2024

(51) Int. Cl.
*H01L 23/488* (2006.01)
*H01L 21/48* (2006.01)
(Continued)

(52) U.S. Cl.
CPC .......... *H01L 23/488* (2013.01); *H01L 21/486* (2013.01); *H01L 23/142* (2013.01);
(Continued)

(58) Field of Classification Search
CPC ... H01L 23/488; H01L 21/486; H01L 23/142; H01L 24/16; H01L 24/32; H01L 24/73;
(Continued)

(56) References Cited

U.S. PATENT DOCUMENTS 6,803,649 B1 * 10/2004 He .......................... H01L 23/50
257/E23.067
9,449,954 B2 * 9/2016 Lin ....................... H01L 25/167
(Continued)

OTHER PUBLICATIONS

International Search Report and Written Opinion for International Patent Application No. PCT/US2024/023282, mailed Jul. 19, 2024, 16 pages.

*Primary Examiner* — Victor A Mandala
(74) *Attorney, Agent, or Firm* — Withrow & Terranova, PLLC

(57) ABSTRACT

A substrate(s) for an integrated circuit (IC) package employing a metal core for improved electrical shielding and structural strength. In one aspect, a substrate comprises a core layer. The core layer comprises a metal core, the metal core having a first surface and a second surface opposite the first surface. The core layer further comprises a first insulation layer on the first surface and a second insulation layer on the second surface. The substrate further comprises a first metallization structure adjacent to the first insulation layer and a second metallization structure adjacent to the second insulation layer. The metal core provides electrical shielding of signals/power routed through the metal core for noise coupling reduction allowing a higher density of signal and power paths to be supported in substrate, while also strengthening structural integrity to prevent or reduce warpage in the IC package.

23 Claims, 12 Drawing Sheets

(51) Int. Cl.
  *H01L 23/00*   (2006.01)
  *H01L 23/14*   (2006.01)
  *H01L 25/18*   (2023.01)
  *H10B 80/00*   (2023.01)
(52) U.S. Cl.
  CPC .............. *H01L 24/16* (2013.01); *H01L 24/32* (2013.01); *H01L 24/73* (2013.01); *H01L 25/18* (2013.01); *H01L 2224/16225* (2013.01); *H01L 2224/32225* (2013.01); *H01L 2224/73204* (2013.01); *H10B 80/00* (2023.02)
(58) Field of Classification Search
  CPC ........... H01L 25/18; H01L 2224/16225; H01L 2224/32225; H01L 2224/73204; H01L 21/4857; H01L 23/49822; H01L 23/49827; H01L 25/105; H10B 80/00
  See application file for complete search history.

(56) References Cited

U.S. PATENT DOCUMENTS

| | | | |
|---|---|---|---|
| 2004/0107569 A1* | 6/2004 | Guzek | H01L 23/142 257/782 |
| 2011/0203839 A1* | 8/2011 | Iwamoto | H05K 3/4608 174/262 |
| 2012/0189826 A1* | 7/2012 | Hayashi | H01L 23/49894 428/212 |
| 2012/0229990 A1* | 9/2012 | Adachi | H01L 23/142 156/278 |
| 2012/0247813 A1* | 10/2012 | Ueda | H01L 23/49894 174/251 |
| 2013/0043584 A1* | 2/2013 | Kwon | H01L 24/06 257/737 |
| 2015/0181698 A1* | 6/2015 | Suganuma | H10F 39/811 174/254 |
| 2015/0257268 A1* | 9/2015 | Kitagawa | H05K 3/007 174/262 |
| 2016/0014878 A1* | 1/2016 | Kilhenny | H10H 20/8585 438/26 |
| 2016/0066417 A1* | 3/2016 | Sugiyama | H05K 3/4641 361/760 |
| 2018/0007792 A1* | 1/2018 | Kawai | H01L 23/5383 |
| 2020/0321323 A1* | 10/2020 | Himeda | H01L 23/145 |
| 2021/0202332 A1* | 7/2021 | Hu | H01L 21/6835 |
| 2022/0028805 A1 | 1/2022 | We et al. | |
| 2022/0385033 A1* | 12/2022 | Shi | H01L 23/13 |
| 2023/0245990 A1* | 8/2023 | Baftiri | H05K 3/4697 |
| 2023/0387032 A1* | 11/2023 | Tong | H01L 23/367 |
| 2024/0321763 A1* | 9/2024 | We | H01L 23/5384 |
| 2024/0332100 A1* | 10/2024 | Mishra | H01L 23/5226 |

* cited by examiner

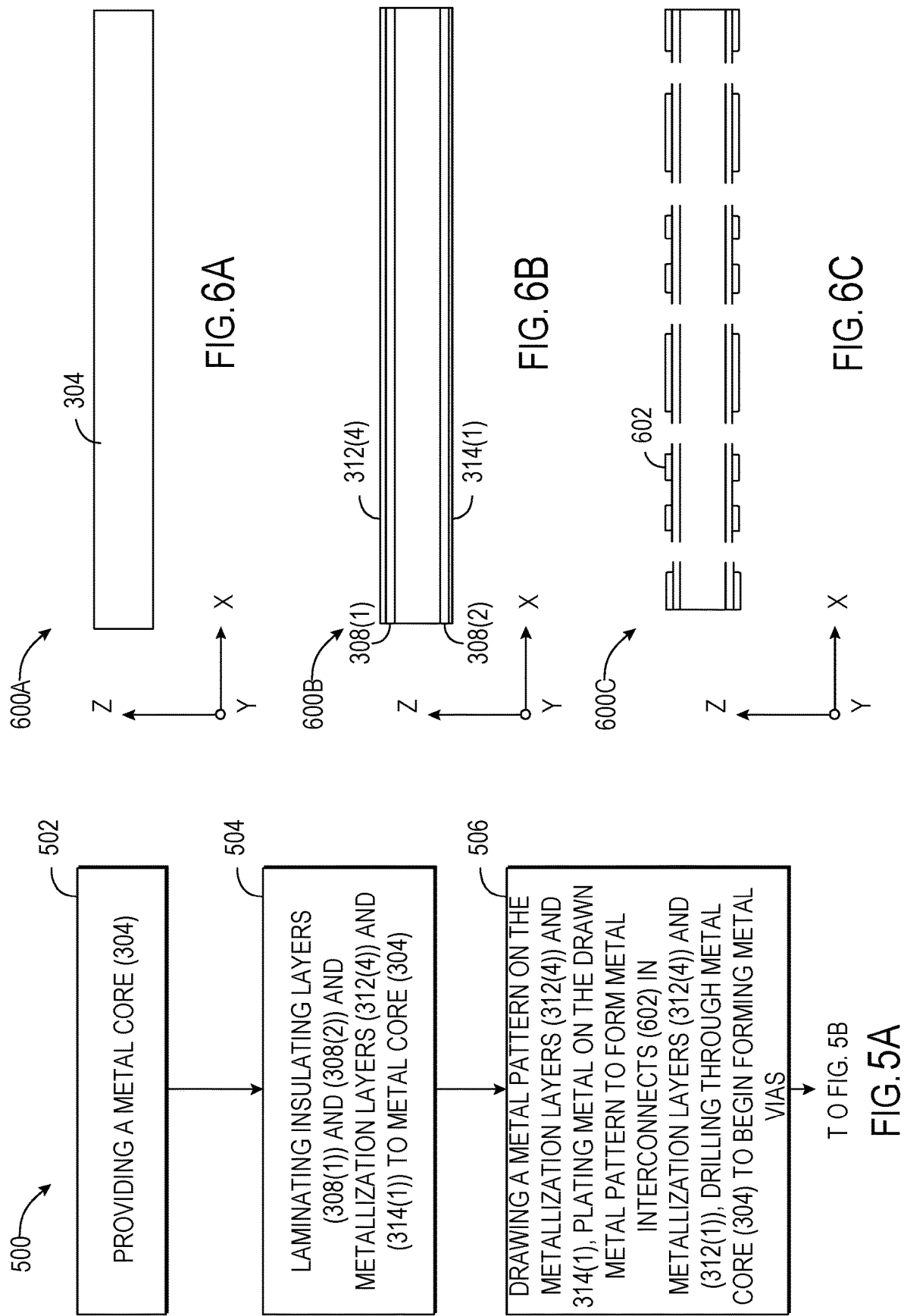

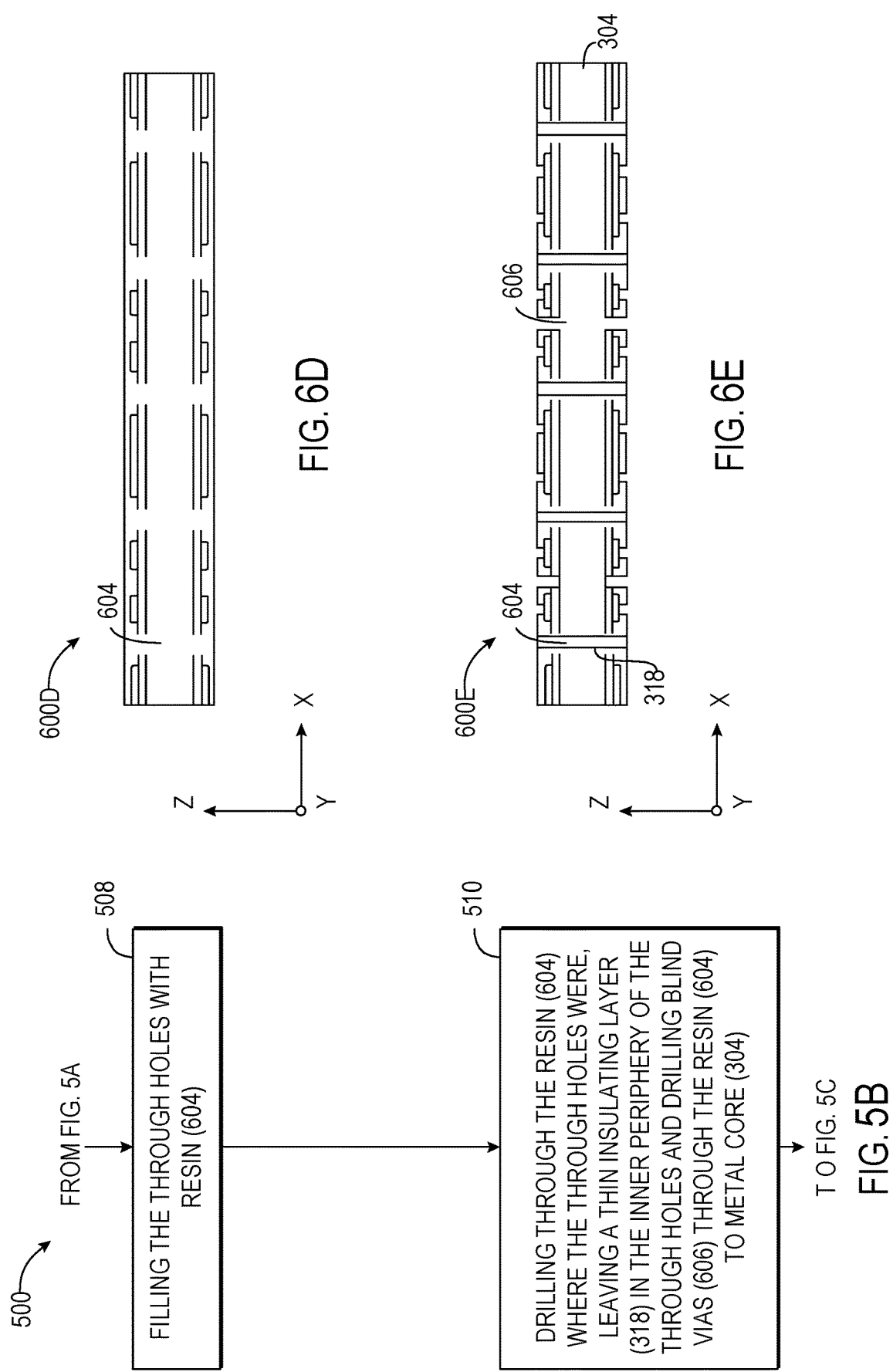

FROM FIG. 5B

512 — FILLING THE THROUGH HOLES WITH METAL TO FORM METAL VIAS (316(1))-(316(5)) FOR ROUTING POWER AND SIGNALS AND FILLING THE BLIND VIAS (606) TO FORM GROUND CONNECTIONS, SUCH AS GROUND PATH (332), TO METAL CORE (304)

514 — FORMING INTERCONNECTS, REDISTRIBUTION LAYERS AND VIAS AT MULTIPLE METALLIZATION LAYERS IN METALLIZATION STRUCTURES (310(1)) AND (310(2))

TO FIG. 5D

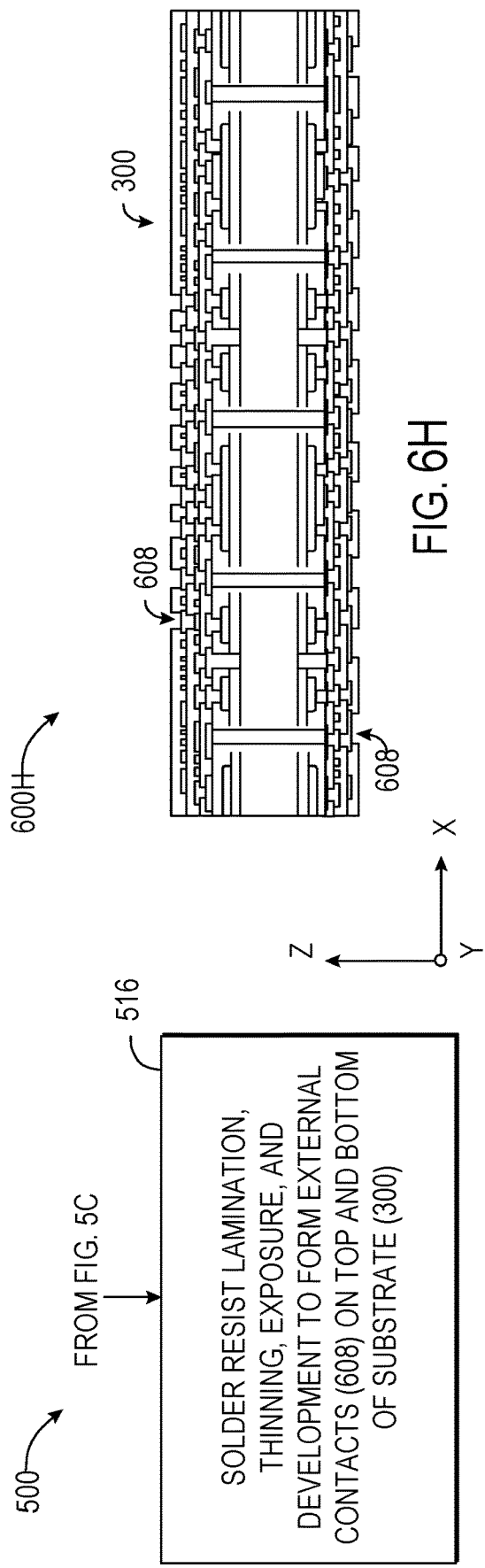

SUBSTRATE(S) FOR AN INTEGRATED CIRCUIT (IC) PACKAGE EMPLOYING A METAL CORE FOR IMPROVED ELECTRICAL SHIELDING AND STRUCTURAL STRENGTH, AND RELATED IC PACKAGES AND FABRICATION METHODS

BACKGROUND

I. Field of the Disclosure

The field of the disclosure relates to integrated circuit (IC) packages, and more particularly to design and manufacture of a substrate within an IC package for enhanced structural support and electrical shielding of signals.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that are mounted on and electrically coupled to a package substrate to provide physical support and an electrical interface to the die(s). The package substrate includes one or more metallization layers that include respective metal layers with metal interconnects (e.g., metal traces, metal lines) with vias coupling the metal interconnects together between adjacent metallization layers to provide electrical interfaces between the die(s). The die(s) is electrically interfaced to metal interconnects exposed in a top or outer metallization layer of the package substrate to electrically couple the die(s) to the metal interconnects of the package substrate. For example, the package substrate may include a laminate substrate or an embedded trace substrate (ETS) layer adjacent to and electrically coupled to a die to provide signal routing paths to the die. Metal interconnects in the outer metallization layer of the package substrate are coupled to other metal interconnects in other, lower metallization layers in the package substrate to provide signal routing paths to a coupled die. The term "adjacent" as used herein means spatially next to but not necessarily adjoining something as shown in the Figures unless specifically stated otherwise.

Some IC packages are known as "hybrid" IC packages, which include multiple die packages with respective dies for different purposes or applications. For example, a hybrid IC package may be an application die, such as a communications modem or processor (including a system). The hybrid IC package could also include, for example, one or more memory dies to provide memory to support data storage and access by the application die. Multiple dies could be disposed in a single die layer and disposed adjacent to each other in a horizontal direction on a package substrate in the IC package. The multiple dies could also be provided in their own respective die packages that are stacked on top of each other in a three-dimensional (3D) arrangement as an overall 3DIC package. A die in a die layer is typically encased in an epoxy molding compound (EMC) to protect the die. 3DIC packages may be desired to reduce the cross-sectional area of the package.

In a 3DIC package, a first, bottom die directly supported on a package substrate is electrically coupled through die interconnects to metallization layers of the package substrate. Metal interconnects (e.g., metal traces, metal lines) in the metallization layers of the package substrate provide signal routing paths to the bottom die. Other stacked dies that are not directly adjacent to the package substrate in the 3DIC package can be electrically coupled to the package substrate by wire bonds and/or an interposer substrate to provide die-to-die (D2D) connections between the multiple stacked dies. An interposer substrate is adjacent to and electrically coupled to a second, top die to provide signal routing paths between the top die and the package substrate for external and/or D2D connections. Similar to a package substrate, an interposer substrate includes one or more metallization layers each with a respective metal layer that includes metal interconnects (e.g., metal traces, metal lines) with vias coupling the metal interconnects together between adjacent metallization layers to provide signal routing paths between the multiple stacked dies through the package substrate. The top die routes electrical signals to metal interconnects exposed in a top, outer metallization layer of the interposer substrate to electrically couple the bottom die through the metal interconnects of the bottom, lower metallization layer of the interposer substrate, vertical die interconnects and metal interconnects in the package substrate to provide signal routing paths to the bottom die.

SUMMARY

Aspects disclosed in the detailed description include a substrate(s) for an integrated circuit (IC) package, wherein the substrate(s) employs a core layer with a metal core for improved electrical shielding and structural strength. Related IC packages and fabrication methods are also disclosed. The IC package includes at least one semiconductor die ("die") coupled to a substrate. The substrate includes one or more metallization layers supporting signal and power routing paths to a die(s). The substrate may be a package substrate of the IC package. If the IC package is a three-dimensional (3D) IC (3DIC) package, the IC package may also include an interposer substrate as another substrate that supports a second die(s) and supports signal routing paths between the second die(s) and the package substrate. The core layer in the substrate(s) of the IC package (e.g., a package substrate and/or interposer substrate) includes a metal core to provide improved electrical shielding and structural strength to the substrate to avoid or reduce warpage in the IC package. For example, the core layer being provided as a metal core can be utilized as a ground plane for the IC package to provide a higher density ground plane for improved shielding, as opposed to, for example, forming a ground plane in a metal layer(s) of reduced thickness in a metallization layer(s) of the substrate. Additionally, utilizing a metal core in the IC package can "free up" additional space in the metallization layers of the substrate to implement additional signal routing paths to support the high-performance die(s). In another exemplary aspect, providing the metal core in the substrate can provide electrical shielding of signal and power paths routed through the metal core for noise coupling reduction to allow a higher density of signal and power paths to be supported in the substrate. The metal core being made of metal can also strengthen structural integrity in the substrate to prevent or reduce warpage in the IC package.

In this regard, in one exemplary aspect, a substrate for an IC package is disclosed. The substrate comprises a core layer. The core layer comprises a metal core, the metal core having a first surface and a second surface opposite the first surface. The core layer further comprises a first insulation layer on the first surface and a second insulation layer on the second surface. The substrate further comprises a first metallization structure adjacent to the first insulation layer and a second metallization structure adjacent to the second insulation layer.

In another exemplary aspect, a method for fabricating a substrate for an IC package is disclosed. The method comprises forming a core layer. The core layer comprises a metal core, the metal core having a first surface and a second surface opposite the first surface. The core layer further comprises a first insulation layer on the first surface and a second insulation layer on the second surface. The method further comprises forming a first metallization structure adjacent to the first insulation layer and forming a second metallization structure adjacent to the second insulation layer.

In another exemplary aspect, an IC package is disclosed. The IC package comprises a substrate. The substrate comprises a core layer comprising a metal core, the metal core having a first surface and a second surface opposite the first surface, a first insulation layer on the first surface, and a second insulation layer on the second surface. The substrate further comprises a first metallization structure adjacent to the first insulation layer and a second metallization structure adjacent to the second insulation layer.

BRIEF DESCRIPTION OF THE DRAWINGS

FIGS. 5A-5D is a flowchart illustrating another exemplary fabrication process of fabricating a routing substrate for an IC package, wherein the routing substrate includes a core layer having a metal core to provide electrical shielding of signal and power paths routed through the metal core for noise coupling reduction to allow a higher density of signal and power paths to be supported in the routing substrate, while also strengthening structural integrity in the routing substrate to prevent or reduce warpage in the IC package;

FIGS. 6A-6H are exemplary fabrication stages during fabrication of the routing substrate according to the fabrication process in FIGS. 5A-5D;

DETAILED DESCRIPTION

Figure 1:
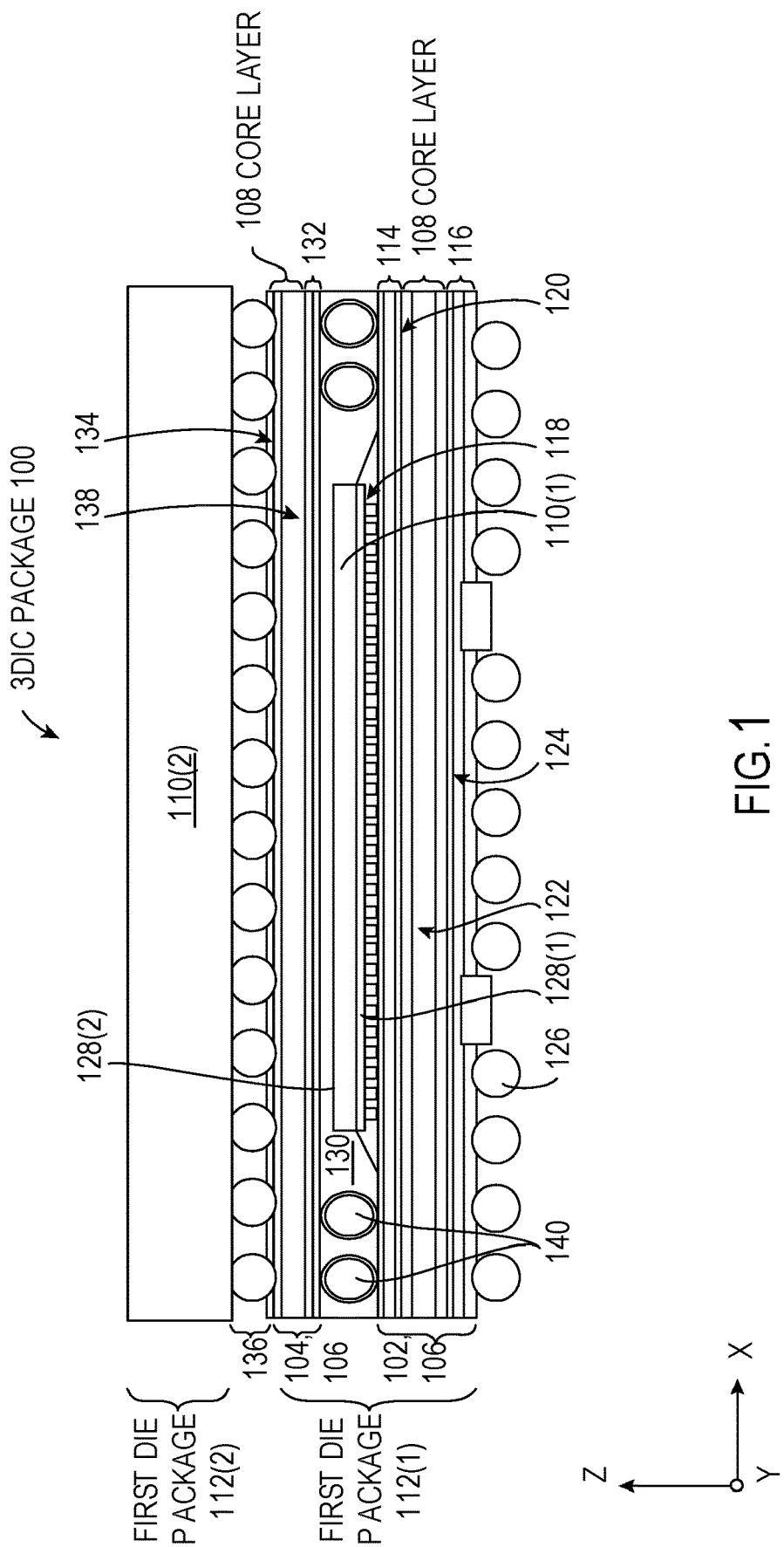
FIG. 1 is a side view of an exemplary three-dimensional (3D) integrated circuit (IC) (3DIC) package that includes a package substrate and interposer substrate as routing substrates that each include a core layer.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a substrate(s) for an integrated circuit (IC) package, wherein the substrate(s) employs a core layer with a metal core for improved electrical shielding and structural strength. Related IC packages and fabrication methods are also disclosed. The IC package includes at least one semiconductor die ("die") coupled to a substrate. The substrate includes one or more metallization layers supporting signal and power routing paths to a die(s). The substrate may be a package substrate of the IC package. If the IC package is a three-dimensional (3D) IC (3DIC) package, the IC package may also include an interposer substrate as another substrate that supports a second die(s) and supports signal routing paths between the second die(s) and the package substrate. The core layer in the substrate(s) of the IC package (e.g., a package substrate and/or interposer substrate) includes a metal core to provide improved electrical shielding and structural strength to the substrate to avoid or reduce warpage in the IC package. For example, the core layer being provided as a metal core can be utilized as a ground plane for the IC package to provide a higher density ground plane for improved shielding, as opposed to, for example, forming a ground plane in a metal layer(s) of reduced thickness in a metallization layer(s) of the substrate. Additionally, utilizing a metal core in the IC package can "free up" additional space in the metallization layers of the substrate to implement additional signal routing paths to support the high-performance die(s). In another exemplary aspect, providing the metal core in the substrate can provide electrical shielding of signal and power paths routed through the metal core for noise coupling reduction to allow a higher density of signal and power paths to be supported in the substrate. The metal core being made of metal can also strengthen structural integrity in the substrate to prevent or reduce warpage in the IC package.

In this regard, FIG. 1 is a side view of an exemplary IC package 100, which in this example is a three-dimensional IC 3DIC package 100. The IC package 100 includes a package substrate 102 and an interposer substrate 104. The package substrate 102 and the interposer substrate 104 each include a core layer 108 and commonly routes signals and power and, thus for convenience, may both be referred to as a routing substrate 106. The routing substrate 106 will be discussed in more detail in connection with the description of FIGS. 2 and 3A-3C below.

In this example, the IC package 100 includes first and second dies 110(1), 110(2) that are included in respective first and second die packages 112(1), 112(2) that are stacked on top of each other in the vertical direction (Z-axis direction). The first die package 112(1) of the IC package 100 includes the first die 110(1) coupled to the package substrate 102. In this example, the package substrate 102 includes a first, upper metallization structure 114 disposed on a core layer 108. The core layer 108 is a central layer of a routing substrate that provides mechanical strength to the IC package 100. The core layer 108 is typically made of a strong dielectric material such as ceramic or glass, but as discussed in more detail in FIGS. 3A-3C, the core layer 108 in that example is a metal core made of a metal material. The core layer 108 is disposed on a second, bottom metallization structure 116. The first, upper metallization structure 114 provides an electrical interface for signal routing to the first die 110(1). The first die 110(1) is coupled to die interconnects 118 (e.g., raised metal bumps) that are electrically coupled to metal interconnects 120 in the first, upper metallization structure 114. The metal interconnects 120 in the first, upper metallization structure 114 are coupled to metal vias 122 (not visible) in the core layer 108, which are coupled to metal interconnects 124 in the second, bottom metallization structure 116. In this manner, the package substrate 102 provides interconnections between its first and second metallization structures 114, 116, and core layer 108 to provide signal routing to the first die 110(1). External interconnects 126 (e.g., ball grid array (BGA) interconnects) are coupled to the metal interconnects 124 in the second, bottom metallization structure 116 to provide interconnections through the package substrate 102 to the first die 110(1) through the die interconnects 118. In this example, a first, active side 128(1) of the first die 110(1) is adjacent to and coupled to the package substrate 102, and more specifically the first, upper metallization structure 114 of the package substrate 102.

In the example IC package 100 in FIG. 1, an additional optional second die package 112(2) is provided and coupled to the first die package 112(1) to support multiple dies. For example, the first die 110(1) in the first die package 112(1) may include an application processor, and the second die 110(1) may be a memory die, such as a dynamic random access memory (DRAM) die that provides memory support for the application processor. In this regard, in this example, the first die package 112(1) also includes the interposer substrate 104 that is disposed on a package mold 130 encasing the first die 110(1), adjacent to a second, inactive side 128(2) of the first die 110(1). The interposer substrate 104 also includes a core layer 108 and one or more metallization structures 132 that each include metal interconnects 134 to provide interconnections to the second die 110(2) in the second die package 112(2). The second die package 112(2) is physically and electrically coupled to the first die package 112(1) by being coupled through external interconnects 136 (e.g., solder bumps, BGA interconnects) to the interposer substrate 104. The external interconnects 136 are coupled to the metal interconnects 134 in the interposer substrate 104 through metal vias 138 (not visible). The first die package 112(1) includes vertical interconnects 140 to couple the second die 110(2) to the external interconnects 126 and to first die 110(1) through package substrate 102.

Figure 2:
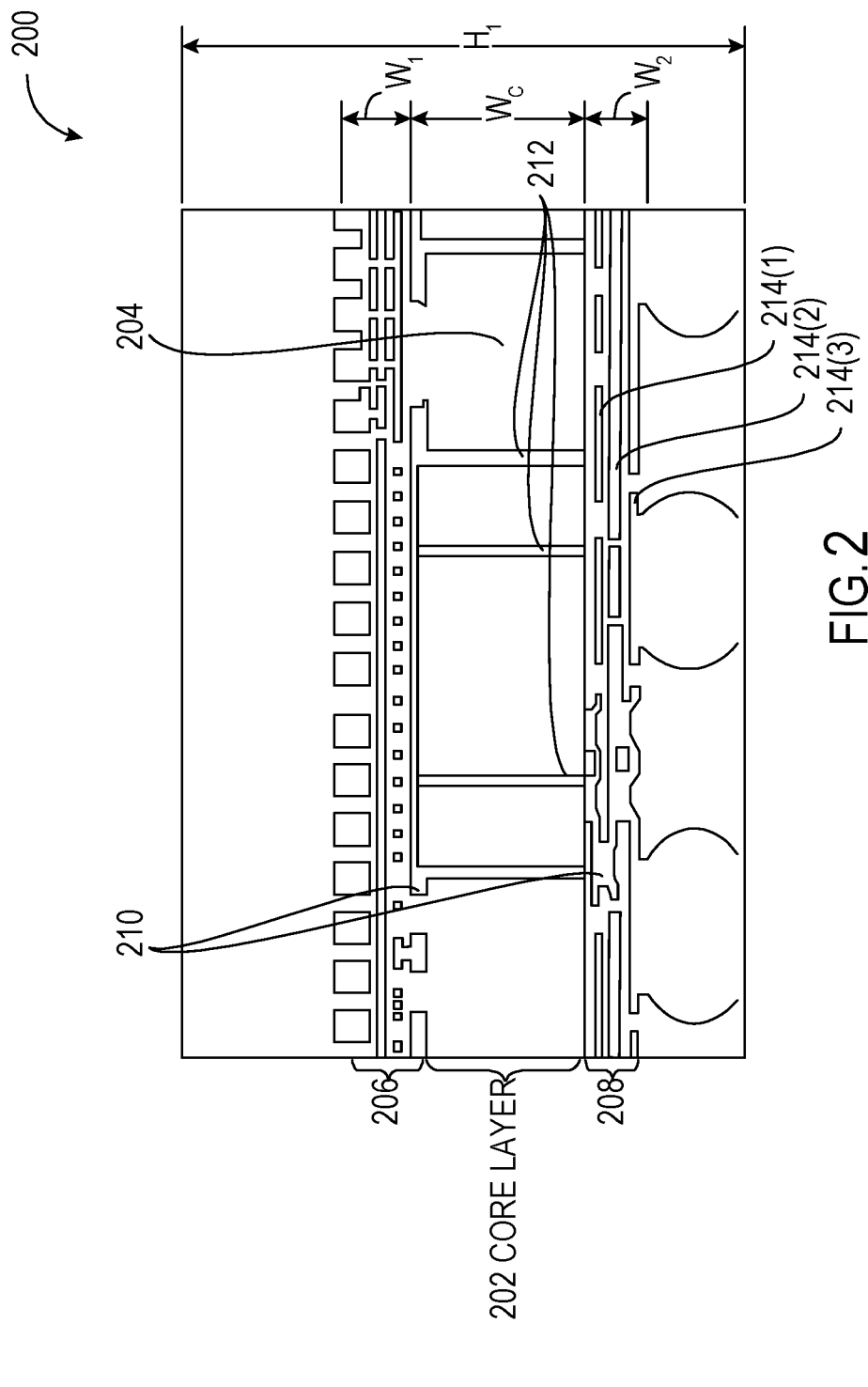
FIG. 2 is a close-up view of an exemplary routing substrate that can be a routing substrate in the IC package in FIG. 1, wherein the routing substrate includes a core layer having a dielectric core.

FIG. 2 is a close-up view of an exemplary routing substrate 200 that can be a routing substrate 106 in the IC package 100 in FIG. 1, wherein the routing substrate 200 includes a core layer 202 having a dielectric core 204. In one example, the dielectric core 204 is made of woven glass and epoxy resin to provide structural support for the routing substrate 200. The routing substrate 200 includes a first, upper metallization structure 206 and a second, lower metallization structure 208. The first and second metallization structures 206, 208 contain metal interconnects including exemplary metal interconnects 210. Metal lines 212 couple the metal interconnects 210 through the core layer 202. The metal lines 212 carry signals, power, and ground lines and are surrounded by dielectric. However, the metal lines 212 are not shielded in this example. Rather, to avoid interference between the metal lines 212, the metal lines 212 must be physically separated in the dielectric core 204 by a certain minimum distance, which then as a result, limits the density of the metal lines 212 and routing paths through the core layer 202.

The first and second metallization structures 206 and 208 can be designed to carry signals and power lines, and provide a ground plane. To support higher performance dies, additional metallization layers may have to be added to support the additional signals and power and to sufficiently isolate the signals and power to avoid interference. The additional metal layers could be added to either the first metallization structure 206 or the second metallization structure 208. Doing so would either increase the width $W_1$ of the first metallization structure 206 or increase the width $W_2$ of the second metallization structure 208. As a result, the overall height $H_1$ of the routing substrate 200 would increase. To avoid increasing the overall height $H_1$ of the routing substrate 200, additional metallization layers could be placed within the core layer 202. But in so doing, the width $W_c$ of the core layer 202 would decrease in order to maintain the overall width of the routing substrate 200. The core layer 202 is a dielectric and reducing its width may compromise the structural integrity of the routing substrate 200.

With continued reference to FIG. 2, the second metallization structure 208 includes three metallization layers 214(1), 214(2), and 214(3). The thickness of these three metallization layers 214(1), 214(2), and 214(3) may be between 5-35 μm. The metallization layers 214(1), 214(2), and 214(3) may include signal routing, power routing, and ground planes. A ground plane that is provided in one or more of the three metallization layers 214(1), 214(2), and 214(3) is limited by the width of the particular metallization layer 214(1), 214(2), and 214(3) and may not be wide enough to provide a stable reference for electrical signals which is required to support high performance dies.

Figure 3A:
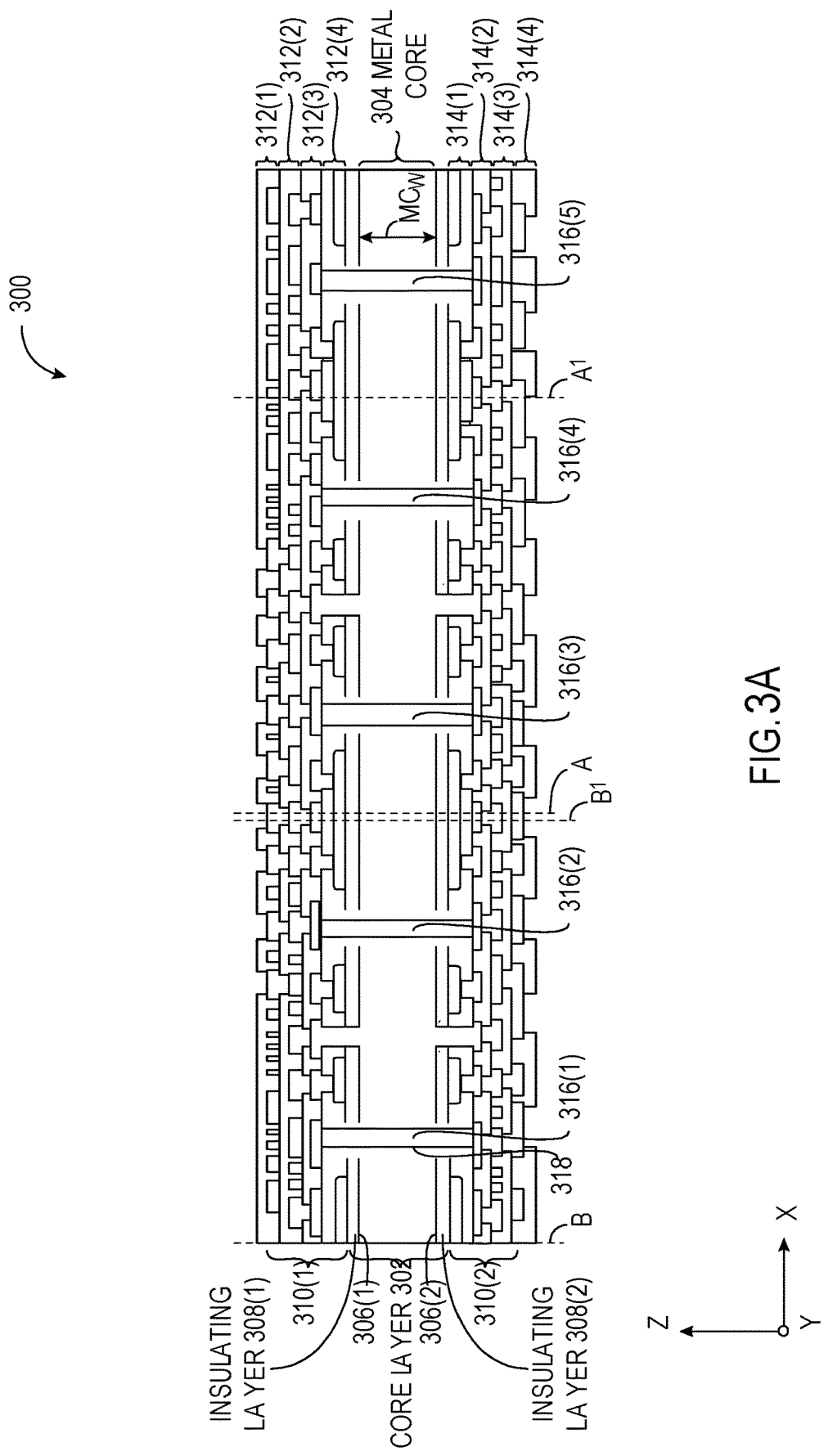
FIG. 3A is a view of another exemplary routing substrate that can be a routing substrate(s) in the IC package in FIG. 1, wherein such routing substrate includes a core layer having a metal core that can provide a ground plane and/or electrical shielding of signal and power paths routed through the metal core for noise coupling reduction to allow a higher density of signal and power paths to be supported in the routing substrate, while also strengthening structural integrity in the routing substrate to prevent or reduce warpage in the IC package.

FIG. 3A is a view of another exemplary routing substrate 300 that can be a routing substrate(s) 106 in the IC package 100 in FIG. 1. In this example, the routing substrate 300 includes a core layer 302 having a metal core 304 that is made from a metal material. Providing the core layer 302 as the metal core 304 in the routing substrate 300 allows the core layer 302 to be utilized as a ground plane for the IC package 100 to provide a higher density ground plane for improved shielding. The metal core 304 has a thickness in the vertical, Z-direction of at least 200 μm. Additionally, utilizing the metal core 304 as the core layer 302 in the routing substrate 300 can "free up" additional space in other metallization layers 312(1)-312(4) and 314(1)-314(4) of the routing substrate 300 to implement additional signal routing paths to support the high-performance die(s). Providing the metal core 304 in the routing substrate 300 can also provide electrical shielding of signal and power paths routed through the metal core 304 for noise coupling reduction to allow a higher density of signal and power paths to be supported in the routing substrate 300. The metal core 304 being made of metal can also strengthen structural integrity in the routing substrate 300 to prevent or reduce warpage in the IC package 100.

As shown in FIG. 3A, the core layer 302 extends in a first, horizontal direction(s) (X- and/or Y-axis direction(s)). The metal core 304 has a first, top surface 306(1) and a second, bottom surface 306(2). The core layer 302 includes a first, top insulation layer 308(1) on the first surface 306(1) and a second, bottom insulation layer 308(2) on the second surface 306(2) of the metal core 304. The routing substrate 300 also includes a first, upper metallization structure 310(1) adjacent to the first insulation layer 308(1) and a second, lower metallization structure 310(2) adjacent to the second insulation layer 308(2). In this exemplary routing substrate 300, the first metallization structure 310(1) includes four metallization layers 312(1), 312(2), 312(3), and 312(4) and the second metallization structure 310(2) includes four metallization layers 314(1), 314(2), 314(3), and 314(4).

Signals and power are routed from the first metallization structure 310(1) to the second metallization structure 310(2) through at least one metal via 316(1)-316(5) that extends in a second, vertical direction (Z-axis direction), thus, coupling the first metallization structure 310(1) with the second metallization structure 310(2). The at least one metal via 316(1)-316(5) is surrounded by an insulation layer 318. The term "via" is a vertical interconnect in the Z-direction that is filled with metal and therefore can be referred to as a metal via. The metal core 304 is coupled to electrical ground forming a ground plane of width, $MC_w$, which is much greater than the width of any of the individual metallization layers 312(1)-312(4) or 314(1)-314(4) to provide a wider, more solid ground plane than any that can be formed in the individual metallization layers 312(1)-312(4) and 314(1)-314(4). Additionally, the metal core 304, as it is at electrical ground, shields the signals and power passing through the at least one metal via 316(1)-316(5) in the same way as a coaxial cable. The metal core 304 is preferably copper, but can include other conductive metals such as aluminum, gold, and silver.

Unlike the routing substrate 200 of FIG. 2, to support high performance die(s), the routing substrate 300 of FIG. 3A provides a wider, more solid ground in the core layer 302 to provide shielding for signal and power coupling between metallization structures and allows additional metallization layers due to high performance die(s) by moving the ground plane to the core layer 302. Additionally, rather than a dielectric core 204, the metal core 304 enhances the structural integrity of the routing substrate. Furthermore, since the metal core 304 increases the overall metal in the routing substrate 300, thermal dissipation may be improved by radiating heat through the metal core 304 and out of the routing substrate 300 through external interconnects 126 and vertical interconnects 140, for example. All of these benefits are provided by the routing substrate 300 without impacting the overall width of the routing substrate.

Figure 3B:
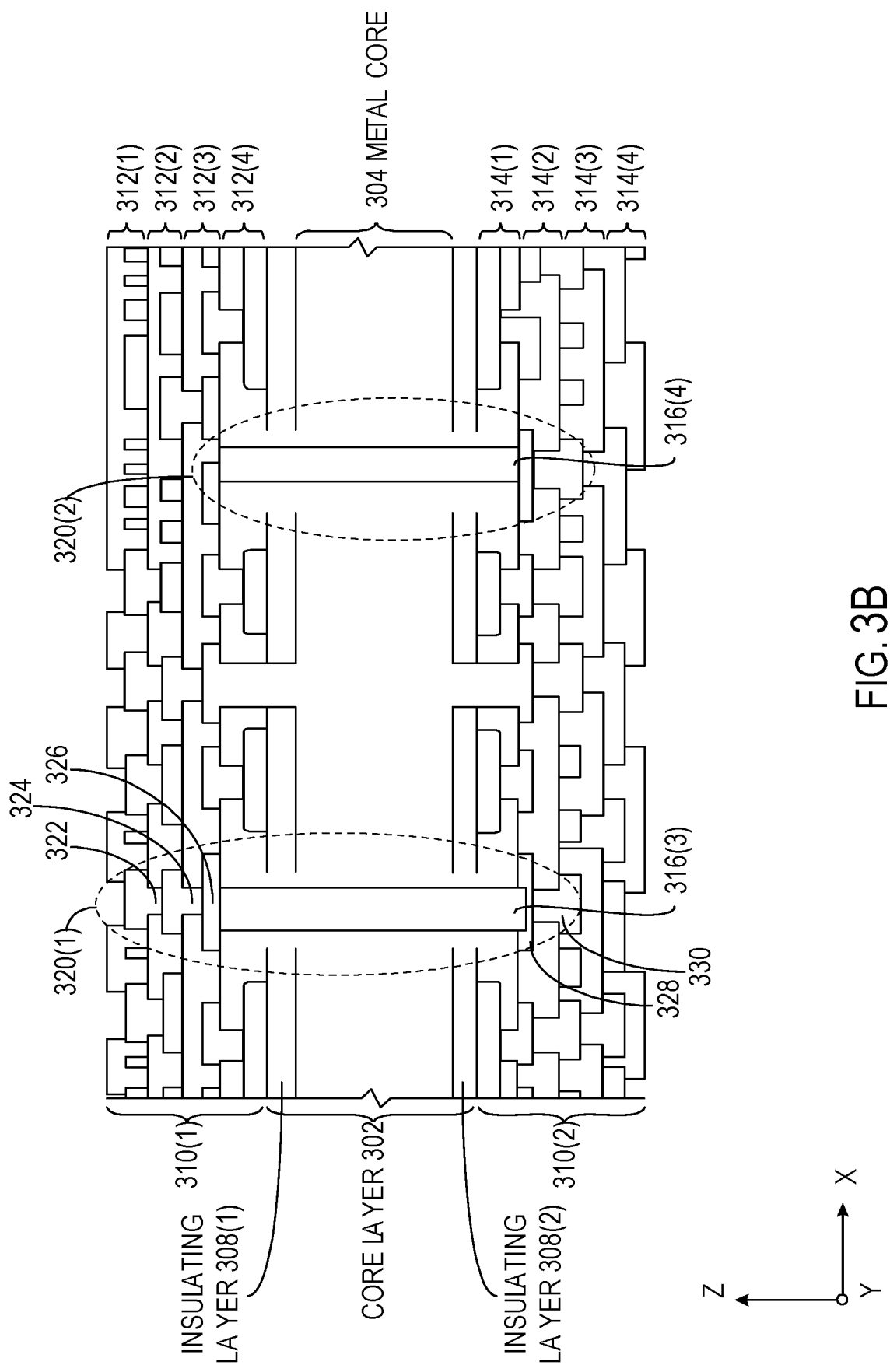
FIG. 3B is a cross-sectional side view of the routing substrate in FIG. 3A, wherein the routing substrate includes the core layer having the metal core.

FIG. 3B is a cross-sectional side view between cut lines A-A[1] of the routing substrate 300 in FIG. 3A, wherein the routing substrate 300 includes the core layer 302 having the metal core 304. The metal core 304 facilitates various routing paths in the routing substrate 300 to flexibly connect any metallization layer 312(1)-312(4) in the first metallization structure 310(1) with any metallization layer 314(1)-314(4) in the second metallization structure 310(2).

For example, in the first metallization structure 310(1), a power/signal line path 320(1) is routed through a first metal interconnect 322 in metallization layer 312(1), a second metal interconnect 324 in metallization layer 312(2), a third metal interconnect 326 in metallization layer 312(3), a metal via 316(3), a fourth metal interconnect 328 in metallization layer 314(2) of the second metallization structure 310(2), and a fifth metal interconnect 330 of metallization layer 314(3) to couple metallization layer 312(1) of the first metallization structure 310(1) with metallization layer 314(3) of the second metallization structure 310(2). The power/signal line path 320(1) is shielded by the metal core 304 as it passes through the metal via 316(3) eliminating interference that could be caused by other metal vias, including, for example, metal vias 316(1), 316(2), 316(4), and 316(5). The power/signal line path 320(1) may be utilized to carry an electrical signal or a power rail, for example.

In another example, in a routing/signal line path 320(2), a metal via 316(4) couples metallization layer 312(3) in the first metallization structure 310(1) with metallization layer 314(4) in the second metallization structure 110(2). The routing/signal line path 320(2) is also shielded by the metal core 304 as it passes through the metal via 316(4) eliminating interference that could be caused by other metal vias, including, for example, metal vias 316(1), 316(2), 316(3), and 316(5). Due to the shielding of at least one metal via 316(1)-316(5) by the metal core 304, a higher density of at least one metal via 316(1)-316(5) can be achieved as compared to the density of unshielded metal lines in FIG. 2.

Figure 3C:
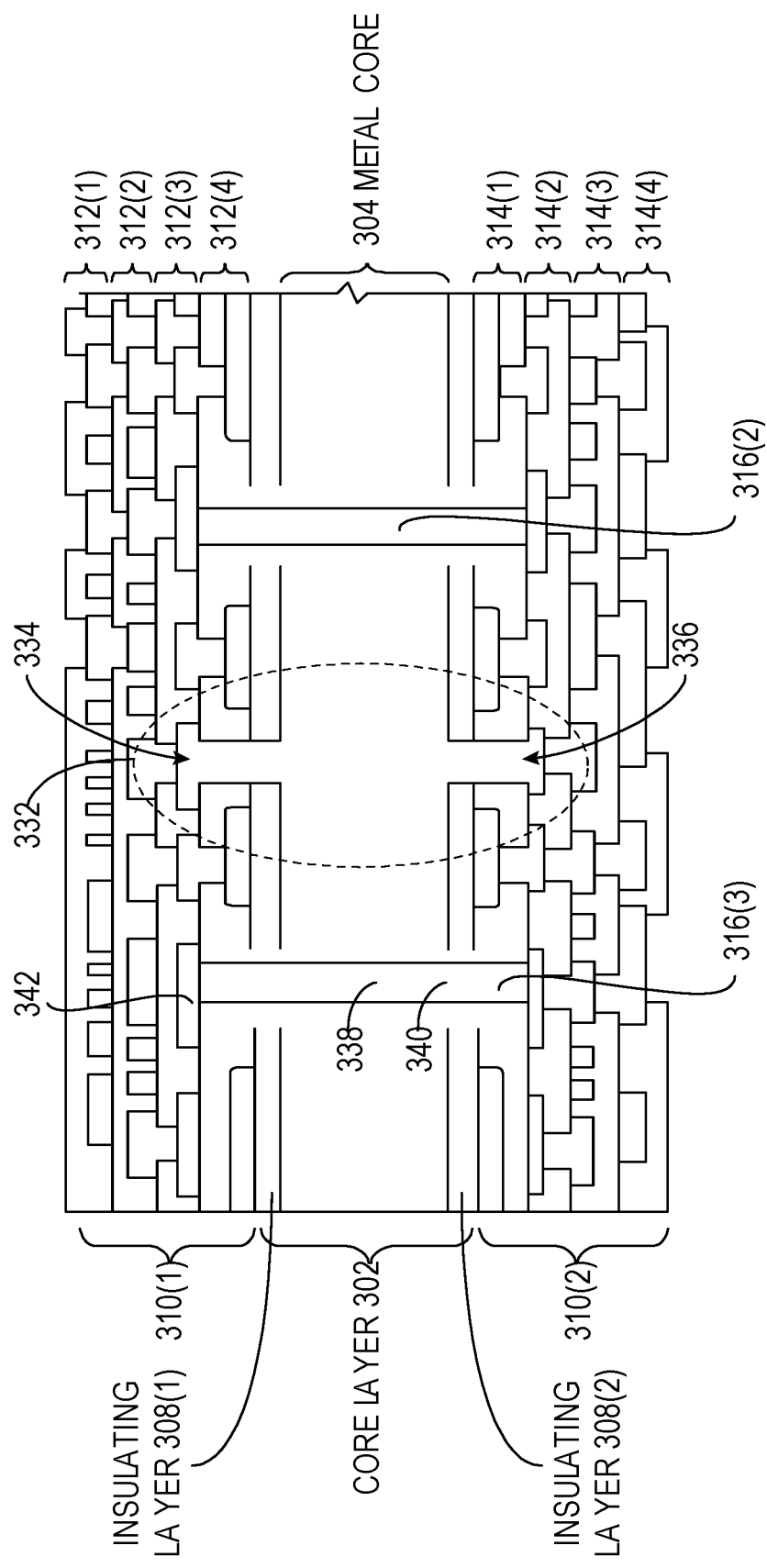
FIG. 3C is another a cross-sectional side view of the routing substrate in FIG. 3A, wherein the routing substrate includes the core layer having the metal core.

FIG. 3C is another a cross-sectional side view between cut lines B-B[1] of the routing substrate 300 in FIG. 3A, wherein the routing substrate 300 includes the core layer 302 having the metal core 304. The metal core 304 facilitates various routing paths for ground in the routing substrate 300 to flexibly connect ground in any metallization layer in the first metallization structure 310(1) to the metal core 304, connect ground in any metallization layer in the second metallization structure 310(2) to the metal core 304, and to route signals and power in the first, horizontal direction(s) (X- and/or Y-axis direction(s)). A ground path 332 shows two exemplary metal blind vias; a first metal blind via 334 in the first metallization structure 310(1) and a second metal blind via 336 in the second metallization structure 310(2). The term "blind via" refers to a via made by drilling through holes in either the first metallization structure 310(1) or the second metallization structure 310(2) that terminate at the metal core 304 and filling the through holes with metal (See FIGS. 5A-5D and 6A-6H). The first metal blind via 334 routes a ground signal from metallization layer 312(2) in the first metallization structure 310(1) to the metal core 304 through metallization layers 312(3) and 312(4). The second metal blind via 336 routes a ground signal from metallization layer 314(3) in the second metallization structure 310(2) to the metal core 304 through metallization layers 314(2) and 314(1). Since the metal core 304 is electrical ground, no metal vias through the metal core 304 are utilized for the ground path 332 in this example. In contrast, an electrical signal 338 or a power rail 340 may be carried over metal via 316(1). A metal interconnect 342 allows the electrical signal 338 or the power rail 340 to be routed along metallization layer 312(3) in the first, horizontal direction(s) (X- and/or Y-axis direction(s)). During fabrication, as will be discussed in connection with FIGS. 5A-5D, blind drilling from both sides of the routing substrate 300 can be utilized to define the ground path 332.

Figure 4:
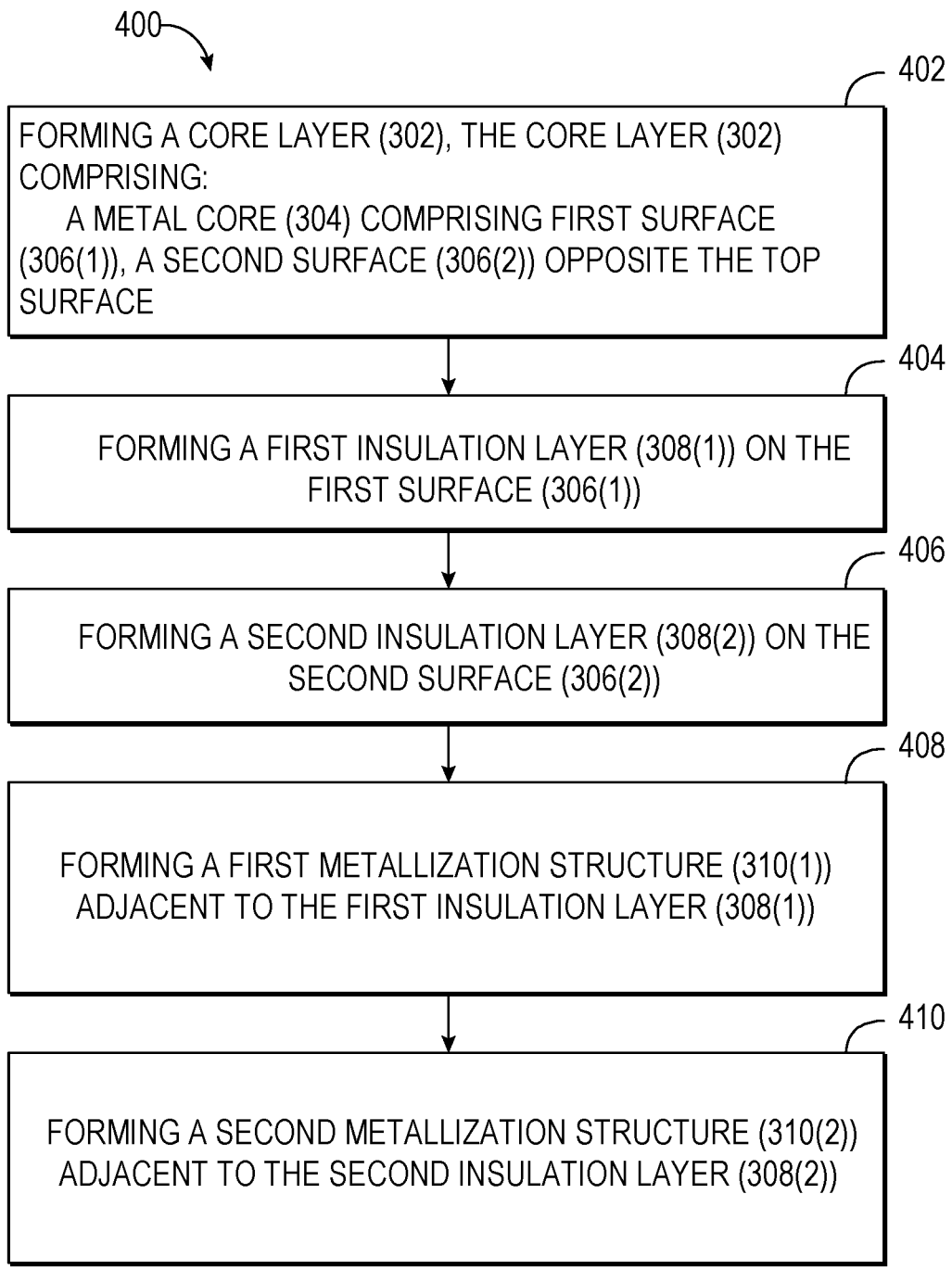
FIG. 4 is a flowchart illustrating an exemplary fabrication process of fabricating a routing substrate for an IC package, wherein the routing substrate includes a core layer having a metal core that can provide a ground plane and/or electrical shielding of signal and power paths routed through the metal core for noise coupling reduction to allow a higher density of signal and power paths to be supported in the routing substrate, while also strengthening structural integrity in the routing substrate to prevent or reduce warpage in the IC package, including, but not limited to, the routing substrates in FIGS. 3A-3C.

A routing substrate that includes a core layer having a metal core that can provide a ground plane and/or electrical shielding of signal and power paths routed through the metal core for noise coupling reduction to allow a higher density of signal and power paths to be supported in routing substrate, while also strengthening structural integrity in the routing substrate to prevent or reduce warpage in the IC package, including, but not limited to, the routing substrate 300 in related IC package 100 in FIGS. 1 and 3A-3C can be fabricated by different fabrication processes. FIG. 4 is a flowchart illustrating an exemplary fabrication process 400 of fabricating a routing substrate 300 for an IC package 100, wherein the routing substrate includes a core layer 302 having a metal core 304 that can provide a ground plane and/or electrical shielding of signal and power paths routed through the metal core for noise coupling reduction to allow a higher density of signal and power paths to be supported in the routing substrate, while also strengthening structural integrity in the routing substrate to prevent or reduce warpage in the IC package, including, but not limited to, the routing substrate 300 in FIGS. 3A-3C.

In this regard, a first exemplary step in the fabrication process 400 of FIG. 4 can include forming a core layer 302. The core layer 302 comprises a metal core 304 comprising a first surface 306(1) and a second surface 306(2) opposite the first surface (block 402 in FIG. 4). A next step in the fabrication process 400 can include forming a first insulation layer 308(1) on the first surface 306(1) (block 404 in FIG. 4). A next step in the fabrication process 400 can include forming a second insulation layer 308(2) on the second surface 306(2) (block 406 in FIG. 4). A next step in the fabrication process 400 can include forming a first metallization structure 310(1) adjacent to the first insulation layer 308(1) (block 408 in FIG. 4). A next step in the fabrication process 400 can include forming a second metallization structure 310(2) adjacent to the second insulation layer 308(2) (block 410 in FIG. 4).

Other fabrication processes can also be employed to fabricate a routing substrate wherein such routing substrate includes a core layer having a metal core that can provide a ground plane and/or electrical shielding of signal and power paths routed through the metal core for noise coupling reduction to allow a higher density of signal and power paths to be supported in the routing substrate, while also strengthening structural integrity in the routing substrate to prevent or reduce warpage in the IC package, including, but not limited to, the routing substrate 300 in related IC package 100 in FIGS. 1 and 3A-3C. In this regard, FIGS. 5A-5D are a flowchart illustrating another exemplary fabrication process 500 of fabricating a routing substrate 300 that includes a metal core 304 to allow a higher density of signal and power paths to be supported in the routing substrate 300, including, but not limited to, the routing substrate 300 and related IC package 100 in FIGS. 1 and 3A-3C. FIGS. 6A-6H are exemplary fabrication stages during fabrication of the routing substrate according to the fabrication process 500 in FIGS. 5A-5D. The fabrication process 500 as shown in the fabrication stages 600A-600h in FIGS. 6A-6H are in reference to the routing substrate 300 and related IC package 100 in FIGS. 1 and 3A-3C, and thus will be discussed with reference to the routing substrate 300 and related IC package 100 in FIGS. 1 and 3A-3C.

In this regard, as shown at fabrication stage 600A in FIG. 6A, an exemplary step in the fabrication process 500 is to provide a metal core 304 (e.g., copper) (block 502 in FIG. 5A). As shown at fabrication stage 600B in FIG. 6B, a next step in the fabrication process 500 can include laminating insulation layers 308(1) and 308(2) and metallization layers 312(4) and 314(1) to the metal core 304 (block 504 in FIG. 5A). By utilizing a metal core 304 with a flat surface, lamination block 504 results in a flat uniform surface to enable patterning that is easier than patterning on a dielectric core which has less flat surface than metal core 304. As shown at fabrication stage 600C in FIG. 6C, a next step in the fabrication process 500 can include drawing a metal pattern on the metallization layers 312(4) and 314(1), plating metal on the drawn metal pattern to form metal interconnects 602 in the metallization layers 312(4) and 314(1), and drilling through the metal core 304 to begin forming metal vias (block 506 in FIG. 5A). Drilling in fabrication stage 600B may be accomplished using a mechanical drill such a computer numerical control (CNC) machine. The metal vias, also known as interstitial vias or inner via hole (IVH), through the metal core 304 will be used in the routing substrate 300 to carry a signal or power which will be shielded by the metal core 304.

As shown at fabrication stage 600D in FIG. 6D, a next step in the fabrication process 500 can include filling the through holes with resin 604 (block 508 in FIG. 5B).

As shown at fabrication stage 600E in FIG. 6E, a next step in the fabrication process 500 can include drilling through the resin 604 where the through holes were, leaving a thin insulation layer 318 in the inner periphery of the through holes and, additionally, drilling blind vias 606, also known as buried or blind via hole (BVH), through the resin 604 to the metal core 304 (block 510 in FIG. 5B). When drilling through resin 604, a laser drill may be used.

Figures 5C, 6F, 6G:
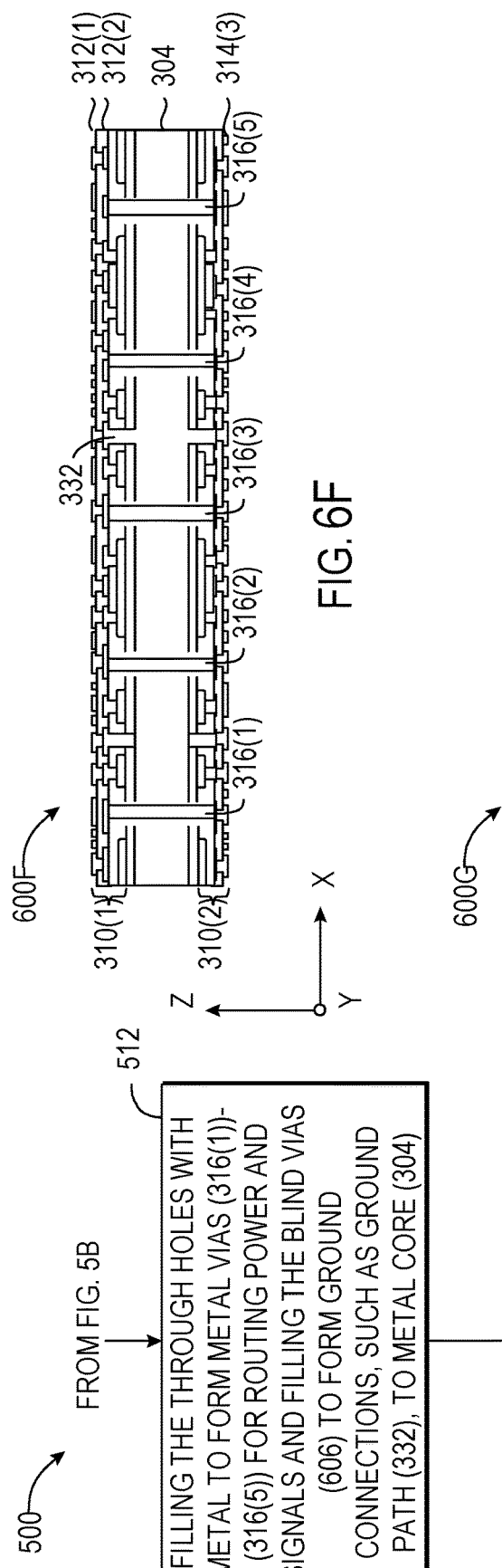

As shown at fabrication stage 600F in FIG. 6F, a next step in the fabrication process 500 can include filling the through holes with metal to form metal vias 316(1)-316(5) for routing power and signals and filling the blind vias 606 to form metal blind vias that can be used as ground connections, such as the ground path 332, to the metal core 304 (block 512 in FIG. 5C). As shown in FIG. 6F, metal via 316(3) couples the first metallization layer 312(1) in the first metallization structure 310(1) to the third metallization layer 314(3) in the second metallization structure 310(2) by extending from the first metallization layer 312(1) to the third metallization layer 314(3). Also as shown in FIG. 6F, metal via 316(1) couples the second metallization layer 312(2) in the first metallization structure 310(1) to the third metallization layer 314(3) in the second metallization structure 310(2) by extending from the second metallization layer 312(2) to the third metallization layer 314(3).

As shown at fabrication stage 600G in FIG. 6G, a next step in the fabrication process 500 can include forming interconnects, redistribution layers, and vias at multiple metallization layers in the metallization structures 310(1) and 310(2) (block 514 in FIG. 5C). Some conventional lithography processes are used to finalize the routing substrate 300 and form interconnects, redistribution layers, and vias at multiple metallization layers in the metallization structures 310(1) and 310(2) including a modified semi-additive process (mSAP), and a semi-additive process (SAP).

As shown at fabrication stage 600H in FIG. 6H, a next step in the fabrication process 500 can include performing a collection of conventional steps including solder resist (SR) lamination, thinning, exposure, and development to form external contacts 608 on the top and bottom of the routing substrate 300. As an example, the external contacts 608 may be used for applying external interconnects 126 and receiving die interconnects 118 as shown in FIG. 1 (block 516 in FIG. 5D).

The routing substrate for an IC package wherein such routing substrate includes a core layer having a metal core that can provide a ground plane and/or electrical shielding of signal and power paths routed through the metal core for noise coupling reduction to allow a higher density of signal and power paths to be supported in the routing substrate, while also strengthening structural integrity in the routing substrate to prevent or reduce warpage in the IC package, including, but not limited to, the routing substrate 300 and its metal core 304 in FIG. 3A-3C, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, and an avionics systems.

Figure 7:
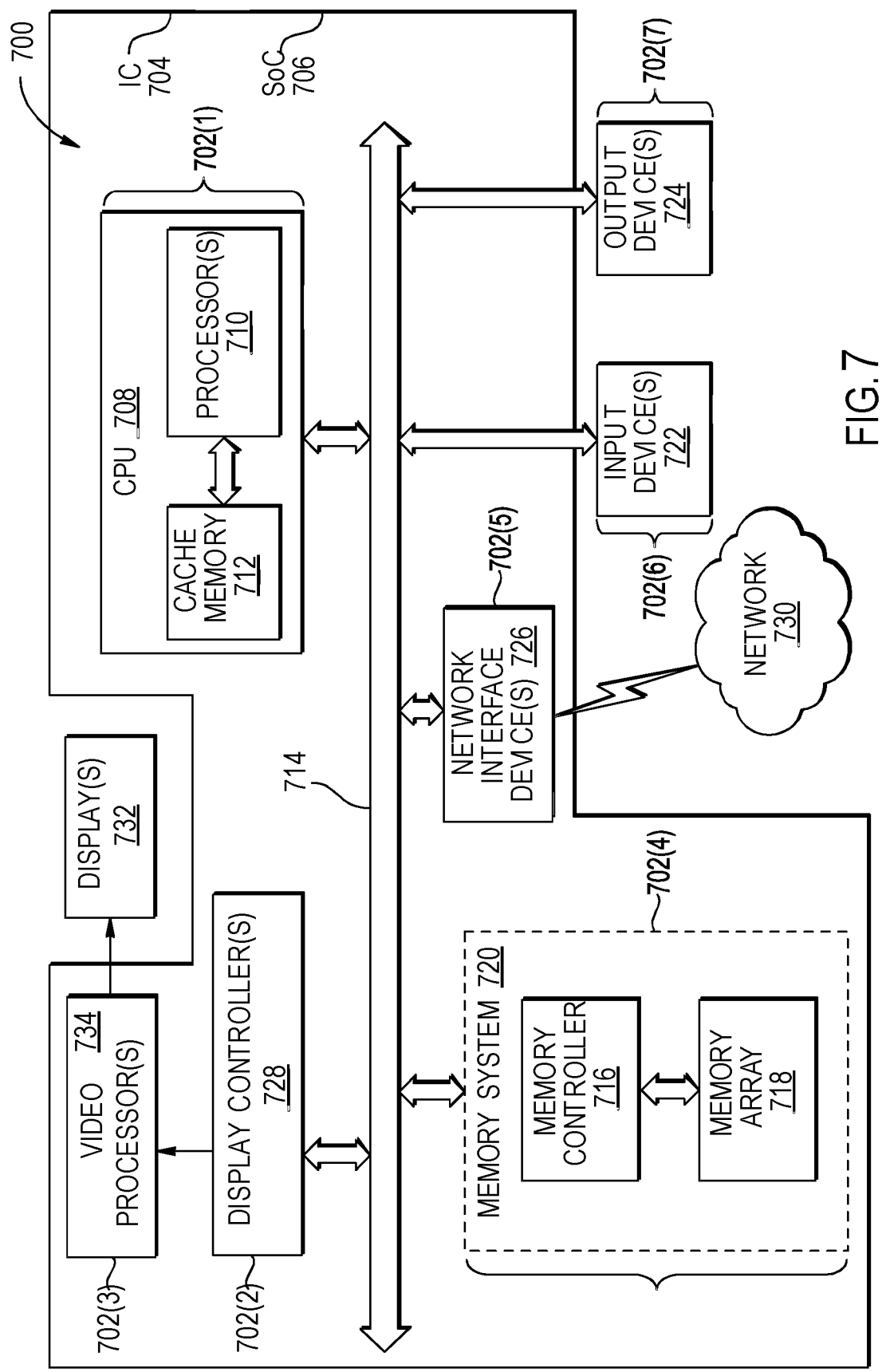
FIG. 7 is a block diagram of an exemplary processor-based system that can include components deployed in an IC package, wherein the IC package includes a routing substrate(s) having a core layer having a metal core to provide electrical shielding of signal and power paths routed through the metal core for noise coupling reduction to allow a higher density of signal and power paths to be supported in the routing substrate, while also strengthening structural integrity in the routing substrate to prevent or reduce warpage in the IC package, including, but not limited to, the routing substrate(s) in FIGS. 1, 3A-3C, and 6A-6H, and according to the exemplary fabrication processes in FIGS. 4-5D.

In this regard, FIG. 7 illustrates an example of a processor-based system 700 that can employ a routing substrate 702 such as the routing substrate 300 illustrated in FIG. 3. In this example, the processor-based system 700 includes one or more central processing units (CPUs) 708, each including one or more processors 710. The CPU(s) 708 may be a master device. The CPU(s) 708 may have cache memory 712 coupled to the processor(s) 710 for rapid access to temporarily stored data. The CPU(s) 708 is coupled to a system bus 714 and can intercouple master and slave devices included in the processor-based system 700. As is well known, the CPU(s) 708 communicates with these other devices by exchanging address, control, and data information over the system bus 714. For example, the CPU(s) 708 can communicate bus transaction requests to a memory controller 716 as an example of a slave device. Although not illustrated in FIG. 7, multiple system buses could be provided, wherein each system bus 714 constitutes a different fabric.

Other master and slave devices can be connected to the system bus 714. As illustrated in FIG. 7, these devices can include a memory system 720, one or more input devices 722, one or more output devices 724, one or more network interface devices 726, and one or more display controllers 728, as examples. The input device(s) 722 can include any type of input device, including, but not limited to, input keys, switches, voice processors, etc. The output device(s) 724 can include any type of output device, including, but not limited to, audio, video, other visual indicators, etc. The network interface device(s) 726 can be any device configured to allow exchange of data to and from a network 730. The network 730 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 726 can be configured to support any type of communications protocol desired. The memory system 720 can include one or more memory arrays 718.

The CPU(s) 708 may also be configured to access the display controller(s) 728 over the system bus 714 to control information sent to one or more displays 732. The display controller(s) 728 sends information to the display(s) 732 to be displayed via one or more video processors 734, which process the information to be displayed into a format suitable for the display(s) 732. The display(s) 732 can include any type of display, including, but not limited to, a cathode ray tube (CRT), a liquid crystal display (LCD), a plasma display, a light emitting diode (LED) display, etc.

Figure 8:
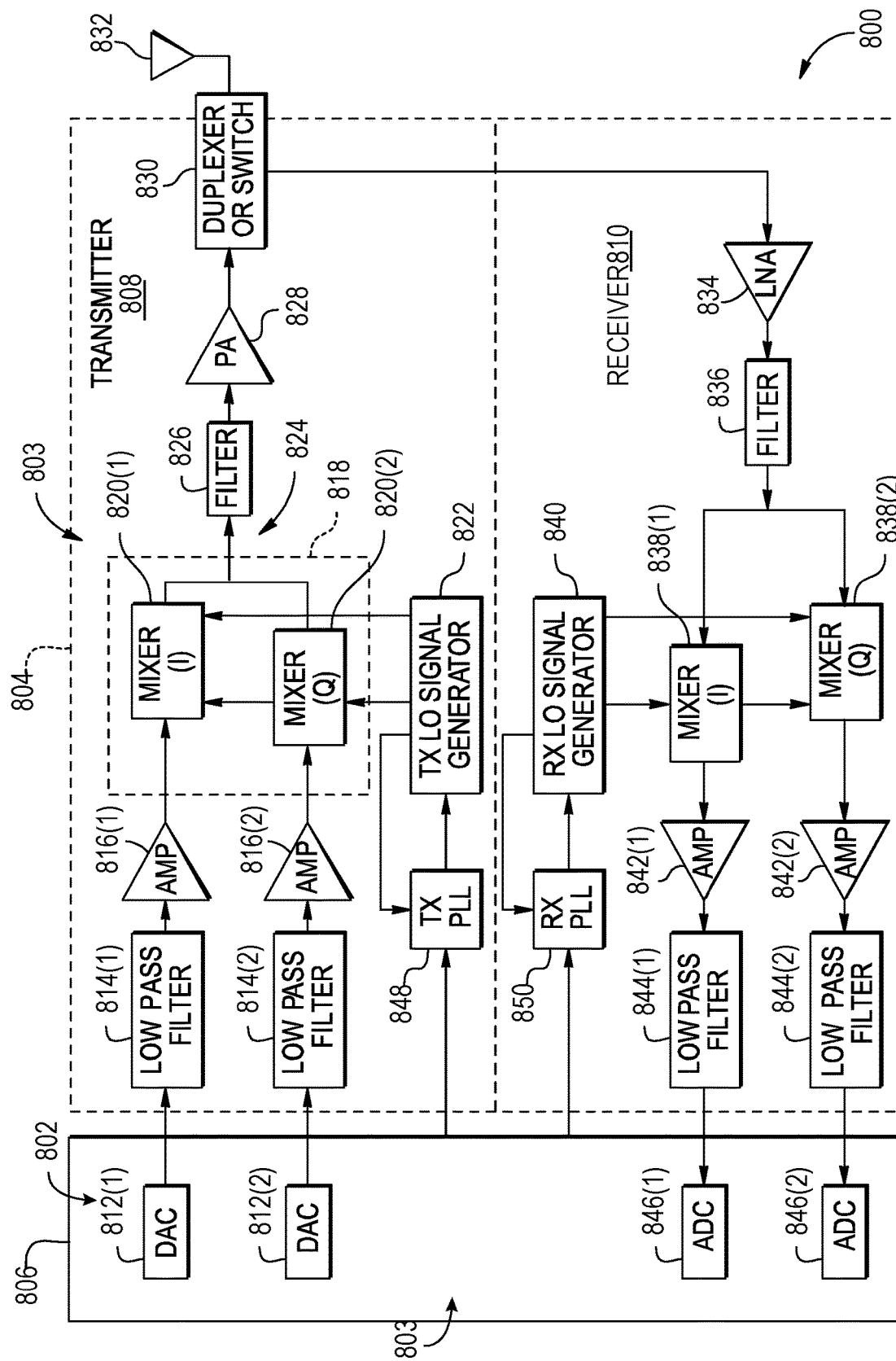
FIG. 8 is a block diagram of an exemplary wireless communications device that includes radio-frequency (RF) components deployed in an IC package, wherein the IC package includes a routing substrate(s) having a core layer having a metal core to provide electrical shielding of signal and power paths routed through the metal core for noise coupling reduction to allow a higher density of signal and power paths to be supported in the routing substrate, while also strengthening structural integrity in the routing substrate to prevent or reduce warpage in the IC package, including, but not limited to, the routing substrate(s) in FIGS. 1 3A-3C, and 6A-6H, and according to the exemplary fabrication processes in FIGS. 4-5D.

FIG. 8 illustrates an exemplary wireless communications device 800 that includes radio frequency (RF) components formed from one or more ICs 802, wherein any of the ICs 802 can include a routing substrate(s) 300 in the IC package 100 in FIG. 1 and described in FIGS. 3A-3C, and according to any aspects disclosed herein, wherein such routing substrate includes a core layer having a metal core that can provide a ground plane and/or electrical shielding of signal and power paths routed through the metal core for noise coupling reduction to allow a higher density of signal and power paths to be supported in the routing substrate, while also strengthening structural integrity in the routing substrate to prevent or reduce warpage in the IC package. The wireless communications device 800 may include or be provided in any of the above-referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RF ICs (RFICs), mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 810. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into I and Q analog output signals, e.g., I and Q output currents, for further processing.

Within the transmitter 808, lowpass filters 814(1), 814(2) filter the I and Q analog output signals, respectively, to remove undesired signals caused by the prior digital-to-analog conversion. Amplifiers (AMPs) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals through mixers 820(1), 820(2) from a TX LO signal generator 822 to provide an upconverted signal 824. A filter 826 filters the upconverted signal 824 to remove undesired signals caused by the frequency up-conversion as well as noise in a receive frequency band. A power amplifier (PA) 828 amplifies the upconverted signal 824 from the filter 626 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Downconversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by AMPs 842(1), 842(2) and further filtered by lowpass filters 844(1), 844(2) to obtain I and Q analog input signals, which are provided to the data processor 806. In this example, the data processor 806 includes analog-to-digital converters (ADCs) 846(1), 846(2) for converting the analog input signals into digital signals to be further processed by the data processor 806.

In the wireless communications device 800 of FIG. 8, the TX LO signal generator 822 generates the I and Q TX LO signals used for frequency upconversion, while the RX LO signal generator 840 generates the I and Q RX LO signals used for frequency downconversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium wherein any such instructions are executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A substrate, comprising:
   a core layer comprising:
      a metal core comprising a first surface and a second surface opposite the first surface;
      a first insulation layer on the first surface; and
      a second insulation layer on the second surface;
   a first metallization structure adjacent to the first insulation layer; and
   a second metallization structure adjacent to the second insulation layer.
2. The substrate of clause 1, wherein:
   the core layer extends in a first direction; and
   the core layer further comprises:
      a metal via extending in a second direction and surrounded by insulation,
         the metal via coupling the first metallization structure with the second metallization structure.
3. The substrate of clause 2, wherein the metal via couples a first metallization layer in the first metallization structure with a first metallization layer in the second metallization structure.
4. The substrate of clause 2, wherein the metal via couples a second metallization layer in the first metallization structure with a first metallization layer in the second metallization structure.
5. The substrate of clauses 1-4, wherein the first metallization structure further comprises:
   a metal blind via extending through the first metallization structure to the metal core.
6. The substrate of clause 5, wherein the metal blind via extends through a second metallization layer of the first metallization structure.
7. The substrate of clauses 1-6, wherein the metal core comprises a ground plane.
8. The substrate of clause 7, wherein the metal via comprises a power rail.
9. The substrate of clause 5, wherein the metal blind via is configured to carry an electrical signal.
10. The substrate of clauses 1-9 comprising a package substrate.
11. The substrate of clauses 1-9 comprising an interposer substrate.
12. The substrate of clauses 1-11 integrated into a device selected from a group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a computer monitor; a television; a tuner; a radio; a satellite radio; a music player; a digital music player; a portable music player; a digital video player; a video player; a digital video disc (DVD) player; a portable digital video player; an automobile; a vehicle component; and an avionics system.
13. A method for fabricating a substrate, comprising:
   forming a core layer, the core layer comprising:
      a metal core comprising a first surface and a second surface opposite the first surface;
      a first insulation layer on the first surface; and
      a second insulation layer on the second surface;
   forming a first metallization structure adjacent to the first insulation layer; and
   forming a second metallization structure adjacent to the second insulation layer.
14. The method of clause 13, wherein:
   the core layer extends in a first direction; and
   the method further comprises:
      forming a metal via extending in a second direction surrounded by insulation and coupling the first metallization structure with the second metallization structure.
15. The method of clause 14, further comprising:
   coupling a first metallization layer in the first metallization structure with a first metallization layer in the second metallization structure through the metal via.
16. The method of clause 14, further comprising:
   coupling a second metallization layer in the first metallization structure with a first metallization layer in the second metallization structure through the metal via.
17. The method of clause 13, further comprising:
   forming a metal blind via extending through the first metallization structure and terminating at the metal core.
18. The method of clause 17, wherein forming the metal blind via through the first metallization structure and terminating at the metal core further comprises:
   forming the metal blind via extending through a second metallization layer in the first metallization structure to the metal core.
19. The method of clause 14, further comprising:
   coupling the metal core to electrical ground.
20. The method of clause 14, further comprising:
   coupling the metal via to a power rail or an electrical signal.
21. The method of clauses 13-20, further comprising:
   coupling a first die to the substrate through die interconnects.
22. The method of clauses 13-20, further comprising:
   coupling a second die to the substrate through an interposer substrate and vertical interconnects.
23. The method of clause 22, further comprising:
   coupling the first die on a package substrate through the die interconnects; and
   coupling the first die to the substrate through the package substrate and vertical interconnects.
24. The method of clause 23, further comprising:
   coupling the second die to the substrate; and
   coupling the second die to the first die through the substrate, the vertical interconnects, and the package substrate.
25 An (IC) package comprising:
   a substrate for the IC package, comprising:
      a core layer comprising:
         a metal core, the metal core having a first surface and a second surface opposite the first surface;
         a first insulation layer on the first surface; and
         a second insulation layer on the second surface;
      a first metallization structure adjacent to the first insulation layer; and
      a second metallization structure adjacent to the second insulation layer.
26. The IC package of clause 25, further comprising:
   a first die coupled to the substrate through die interconnects.
27. The IC package of clause 26, further comprising:
   a plurality of vertical interconnects;
   an interposer substrate; and a second die coupled to the substrate through the interposer substrate and the plurality of vertical interconnects.

28. The IC package of clause 26, further comprising:
a package substrate; and
a second die coupled to the package substrate and coupled to the first die through the substrate.

29. The IC package of clause 25, wherein:
the core layer extends in a first direction; and
the core layer further comprises:
a metal via extending in a second direction surrounded by insulation and coupling the first metallization structure with the second metallization structure.

30. The IC package of clause 29, wherein the metal via couples a first metallization layer in the first metallization structure with a first metallization layer in the second metallization structure.

What is claimed is:

1. A substrate, comprising:
a core layer comprising:
a metal core comprising a first surface and a second surface opposite the first surface;
a first insulation layer on the first surface; and
a second insulation layer on the second surface;
a first metallization structure adjacent to the first insulation layer; and
a second metallization structure adjacent to the second insulation layer,
wherein the first metallization structure further comprises:
a first metal blind via extending from a second metallization layer of the first metallization structure directly through a third metallization layer and a fourth metallization layer of the first metallization structure to the metal core; and
a second metal blind via extending from a first metallization layer directly through the second metallization layer of the first metallization structure to the metal core.

2. The substrate of claim 1, wherein:
the core layer extends in a first direction; and
the core layer further comprises:
a metal via extending in a second direction and surrounded by insulation, the metal via coupling the first metallization structure with the second metallization structure.

3. The substrate of claim 2, wherein the metal via couples a first metallization layer in the first metallization structure with a first metallization layer in the second metallization structure.

4. The substrate of claim 2, wherein the metal via couples a second metallization layer in the first metallization structure with a first metallization layer in the second metallization structure.

5. The substrate of claim 2, wherein the metal core comprises a ground plane.

6. The substrate of claim 5, wherein the metal via comprises a power rail.

7. The substrate of claim 1, wherein the first metal blind via is configured to carry an electrical signal.

8. The substrate of claim 1 comprising a package substrate.

9. The substrate of claim 1 comprising an interposer substrate.

10. The substrate of claim 1 integrated into a device selected from a group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a computer monitor; a television; a tuner; a radio; a satellite radio; a music player; a digital music player; a portable music player; a digital video player; a video player; a digital video disc (DVD) player; a portable digital video player; an automobile; a vehicle component; and an avionics system.

11. A method for fabricating a substrate, comprising:
forming a core layer, the core layer comprising: a metal core comprising a first surface and a second surface opposite the first surface; a first insulation layer on the first surface; and a second insulation layer on the second surface; forming a first metallization structure adjacent to the first insulation layer; and forming a second metallization structure adjacent to the second insulation layers forming a first metal blind via extending from a second metallization layer of the first metallization structure directly through a third metallization layer and a fourth metallization layer of the first metallization structure and terminating at the metal core and, forming a second metal blind via extending from a first metallization layer directly through the second metallization layer in the first metallization structure to the metal core.

12. The method of claim 11, wherein:
the core layer extends in a first direction; and
the method further comprises:
forming a metal via extending in a second direction surrounded by insulation and coupling the first metallization structure with the second metallization structure.

13. The method of claim 12, further comprising:
coupling a first metallization layer in the first metallization structure with a first metallization layer in the second metallization structure through the metal via.

14. The method of claim 12, further comprising:
coupling a second metallization layer in the first metallization structure with a first metallization layer in the second metallization structure through the metal via.

15. The method of claim 12, further comprising:
coupling the metal core to electrical ground.

16. The method of claim 12, further comprising:
coupling the metal via to a power rail or an electrical signal.

17. The method of claim 11, further comprising:
coupling a first die to the substrate through die interconnects.

18. The method of claim 17, further comprising:
coupling a second die to the substrate through an interposer substrate and vertical interconnects.

19. The method of claim 18, further comprising:
coupling the first die on a package substrate through the die interconnects; and
coupling the first die to the substrate through the package substrate and vertical interconnects.

20. The method of claim 19, further comprising:
coupling the second die to the substrate; and
coupling the second die to the first die through the substrate, the vertical interconnects, and the package substrate.

21. An (IC) package comprising:
a substrate for the IC package, comprising:
a core layer comprising:
a metal core, the metal core having a first surface and a second surface opposite the first surface;

a first insulation layer on the first surface; and
a second insulation layer on the second surface;
a first metallization structure adjacent to the first insulation layer;
a second metallization structure adjacent to the second insulation layer;
a first die coupled to the substrate through die interconnects;
a plurality of vertical interconnects;
an interposer substrate;
a second die coupled to the substrate through the interposer substrate and the plurality of vertical interconnects;
a package substrate; and
a second die coupled to the package substrate and coupled to the first die through the substrate.

22. The IC package of claim 21, wherein:
the core layer extends in a first direction; and
the core layer further comprises:
a metal via extending in a second direction surrounded by insulation and coupling the first metallization structure with the second metallization structure.

23. The IC package of claim 22, wherein the metal via couples a first metallization layer in the first metallization structure with a first metallization layer in the second metallization structure.

* * * * *